United States Patent
Caneau et al.

(10) Patent No.: US 8,514,902 B2
(45) Date of Patent: *Aug. 20, 2013

(54) P-TYPE ISOLATION BETWEEN QCL REGIONS

(75) Inventors: Catherine G. Caneau, Corning, NY (US); Feng Xie, Painted Post, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 259 days.

This patent is subject to a terminal disclaimer.

(21) Appl. No.: 13/050,026

(22) Filed: Mar. 17, 2011

(65) Prior Publication Data
US 2012/0236889 A1 Sep. 20, 2012

(51) Int. Cl.
*H01S 5/00* (2006.01)
*H01L 21/00* (2006.01)

(52) U.S. Cl.
USPC ............ 372/45.01; 372/45.012; 438/22

(58) Field of Classification Search
USPC ............ 372/45.01, 45.012; 257/E33.001; 438/22
See application file for complete search history.

(56) References Cited

U.S. PATENT DOCUMENTS

| | | |
|---|---|---|
| 5,151,913 A | 9/1992 | Ueno |
| 6,560,259 B1 | 5/2003 | Hwang |
| 6,744,074 B2 | 6/2004 | Horie et al. |
| 7,274,710 B2 | 9/2007 | Cummings et al. ........... 370/462 |
| 7,274,719 B2 | 9/2007 | Bour et al. ................. 372/45.01 |
| 7,349,456 B2 | 3/2008 | Bour et al. |
| 7,505,502 B2 | 3/2009 | Kashima et al. |
| 7,843,982 B2 | 11/2010 | Chua et al. |
| 2006/0203865 A1 | 9/2006 | Bour et al. ................. 372/43.01 |
| 2006/0215720 A1 | 9/2006 | Corzine et al. |
| 2010/0309942 A1 | 12/2010 | Belkin ....................... 372/45.01 |
| 2012/0236890 A1* | 9/2012 | Caneau et al. ............. 372/45.01 |

FOREIGN PATENT DOCUMENTS

WO 2007/007434 A1 1/2007

OTHER PUBLICATIONS

Gresh Tobias et al: "Gain measurements in strain-compensated quantum cascade laser" Applied Physics letters, AIP, American Institute of Physics, Melville, NY US, vol. 94, No. 16, Apr. 24, 2009, pp. 161114-1-16114-3, XP012120937, ISSN: 003-6951, DOI: 10.1063/1.3123390 pp. 161114-1, left-hand column, last paragraph—right-hand column, last paragraph.

(Continued)

*Primary Examiner* — Armando Rodriguez
(74) *Attorney, Agent, or Firm* — Bruce P. Watson

(57) ABSTRACT

A quantum cascade laser and its method of fabrication are provided. The quantum cascade laser comprises one or more p-type electrical isolation regions and a plurality of electrically isolated laser sections extending along a waveguide axis of the laser. An active waveguide core is sandwiched between upper and lower n-type cladding layers and the active core and the upper and lower n-type cladding layers extend through the electrically isolated laser sections of the quantum cascade laser. A portion of the upper n-type cladding layer comprises sufficient p-type dopant to have become p-type and to have become an electrical isolation region, which extends across at least a part of the thickness upper n-type cladding layer along a projection separating the sections of the quantum cascade laser.

22 Claims, 4 Drawing Sheets

(56) References Cited

OTHER PUBLICATIONS

Vitiello Miriam et al: "Influence of InAs, AlAsI' layers on the optical, electronic, and thermal characteristics of strain-compensated GaInAsa AlInAs quantum-cascade lasers" Applied Physics, Melville, NY, US, vol. 91, No. 16, Oct. 17, 2007, pp. 16111-1-16111-3, XP012099702, ISSN: 003-6951, DOI: 10.1063/1.2798061 pp. 16111-1, right-hand column, last paragraph.

Wienold M et al: "Fe-implantation for rear-facet coatings of InP-based quantum cascade lasers" Electronics Letters, IEE Stevenage, GB, vol. 44, No. 4, Feb. 14, 2008, pp. 293-295, XP006030526 ISSN: 0013-5194 the whole document.

H. Page, et al., "High reflectivity metallic mirror coatings for mid-infrared ($\lambda \approx 9\mu m$) unipolar semiconductor lasers," Semiconductor Sci. Technol., 2002, vol. 17, pp. 1312-1316.

M. Pantouvaki, et al., "Fast Tuneable InGaAsP DBR Laser Using Quantum-Confined Stark-Effect-Induced Refractive Index Change," IEEE Journal of Selected Topics in Quantum Electronics, Sep./Oct. 2007, vol. 13, No. 5, pp. 1112-1121.

D. Soderstrom, et al., "Dopant diffusion and current-voltage studies on epitaxial InP codoped with Ru and Fe", Journal of Electronic Materials, 2001, vol. 30, No. 8, pp. 972-976.

D. Bimberg, et al., "Novel ways to grow thermally stable semi-insulating InP-based layers", Journal of Crystal Growth, Dec. 2, 1994, vol. 145, Issues 1-4, No. 8, pp. 455-461.

\* cited by examiner

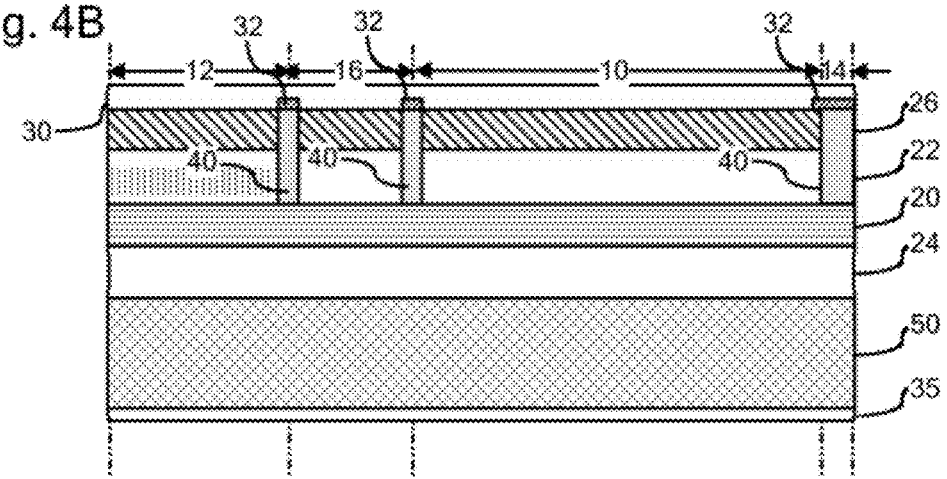
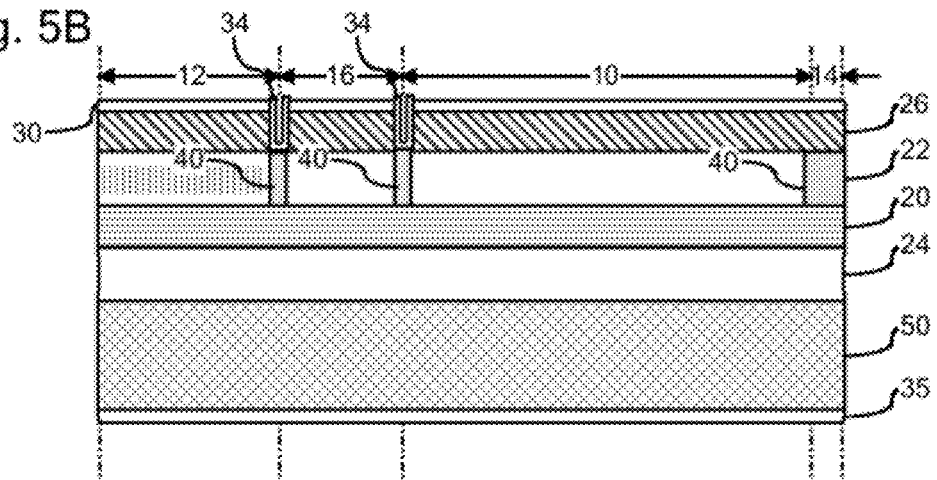

P-TYPE ISOLATION BETWEEN QCL REGIONS

CROSS REFERENCE TO RELATED APPLICATIONS

This application is related to U.S. patent application Ser. No. 13/050,058, filed Mar. 17, 2011, for "P-Type Isolation Regions Adjacent Semiconductor Laser Facets."

BACKGROUND OF THE INVENTION

1. Field of the Invention

A quantum cascade laser (QCL) is a unipolar semiconductor device that can be readily engineered to emit over a variety of wavelengths, including but not limited to, the mid-infrared and terahertz portions of the electromagnetic spectrum. Device growth and processing can be based on established techniques and widely available materials, such as InP and GaAs and other III-V semiconductor materials. The present disclosure relates to quantum cascade semiconductor lasers (QCLs) and, more particularly, to methods of fabricating QCLs and the corresponding QCL structures.

2. Technical Background

The present inventors have recognized that, in semiconductor lasers that utilize interband lasing transitions, the quantum wells and barrier layers that compose the active region are often sandwiched between n-type and p-type layers on opposite sides of the active region, with the p-type layers typically above the active region. These p-type layers are typically not very conductive. Therefore, interrupting the electrical contact layer or metal on top of the p-doped layer(s) typically provides sufficient electrical isolation between distinct regions of the laser structure. In contrast, the present inventors have recognized that a QCL is a unipolar device where the layers both below and above the active core are of the same conductivity type, typically n-type, and that n-type layers are highly conductive. Accordingly, electron diffusion from one area to an adjacent area above the active core cannot be prevented simply by interrupting the electrical contact layer or metal between sections of the n-type layer to be electrically isolated.

Although the methodology of the present disclosure has applicability to a variety of semiconductor laser configurations, the present inventors have recognized that the need for effective isolation is particularly acute in the context of distributed Bragg reflector (DBR) QCLs, which comprise an active region, a wavelength selective region, and, optionally, a phase region.

BRIEF SUMMARY

In accordance with one embodiment of the present disclosure, a quantum cascade laser and its method of fabrication are provided. The quantum cascade laser comprises one or more p-type electrical isolation regions and a plurality of electrically isolated laser sections extending along a waveguide axis of the laser. An active waveguide core is sandwiched between upper and lower n-type cladding layers. The active core and the lower n-type cladding layer, as well as at least part of the upper cladding layer, extend through the electrically isolated laser sections of the quantum cascade laser. A portion or portions of the upper n-type cladding layer comprise sufficient p-type dopant to define p-type electrical isolation region(s), which extend across part of the thickness of the upper n-type cladding layer along a projection separating the sections of the quantum cascade laser. The upper and lower n-type cladding layers may comprise InP, GaAs, AlGaAs, or any other conventional or yet-to-be developed cladding material suitable for the fabrication of a QCL. For example, and not by way of limitation, it is contemplated that a variety of cladding materials might be suitable in a QCL, including II-VI semiconductors, Si—Ge or GaN-based materials, etc.

In accordance with other embodiments of the present disclosure, laser structures are also contemplated where isolation regions are solely provided adjacent one or both of the laser facets to provide vertical isolation, reduce current, and help minimize potentially harmful facet heating.

BRIEF DESCRIPTION OF THE DRAWINGS

The following detailed description of specific embodiments of the present disclosure can be best understood when read in conjunction with the following drawings, where like structure is indicated with like reference numerals and in which:

FIGS. 4B and 5B illustrate alternatives to the window configurations illustrated in FIGS. 4A and 5A.

DETAILED DESCRIPTION

Figure 1:
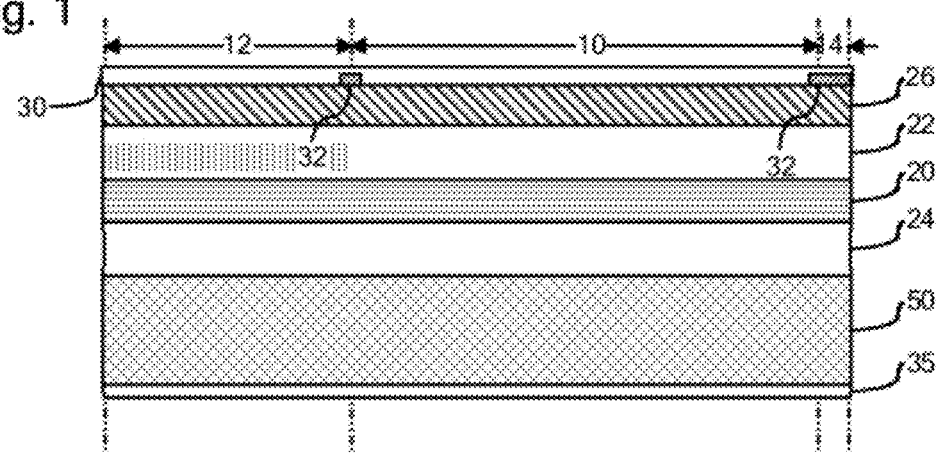
FIG. 1 is a schematic illustration of a DBR quantum cascade laser comprising an active gain section, a wavelength selective section, and a window section.

Although the concepts of the present disclosure enjoy applicability to any type of multi-section QCL, specific embodiments of the present disclosure are illustrated herein with reference to DBR quantum cascade lasers. Nevertheless, the present disclosure and accompanying claims should not be limited to DBR lasers or to the specific materials mentioned in the present description, unless otherwise expressly noted. For example, and not by way of limitation, FIG. 1 is a schematic illustration of a DBR quantum cascade laser comprising an active gain section 10, a wavelength selective section 12 commonly referred to as a DBR section, and an output window section 14. As will be appreciated by those familiar with DBR quantum cascade lasers, the active gain section 10 of the DBR quantum cascade laser provides the major optical gain of the laser while the wavelength selective section 12 provides for wavelength selection. For example, although the wavelength selective section 12 may be provided in a number of suitable configurations that may or may not employ a Bragg grating, in many cases the wavelength selective section 12 comprises a first order or second order Bragg grating that is positioned outside the active gain section 10 of the laser cavity. The grating acts as a mirror whose reflection coefficient depends on wavelength.

FIGS. 4A, 4B, 5A and 5B illustrate three section DBR lasers where a phase section 16 is provided between the wavelength selective section 12 and the active gain section 10 of the DBR quantum cascade laser. The phase section 16 creates an adjustable phase shift between the gain section 10 and the wavelength selective section 12. The phase section 16 may also be used to reduce the thermal coupling between the gain section 10 and the wavelength selective section 12 to reduce the lasing wavelength shift due to thermal cross-talk. The concepts of the present disclosure enjoy applicability to all types of DBR quantum cascade lasers, regardless of whether they are two-section, three-section, or four-section DBR lasers.

Figure 2A:
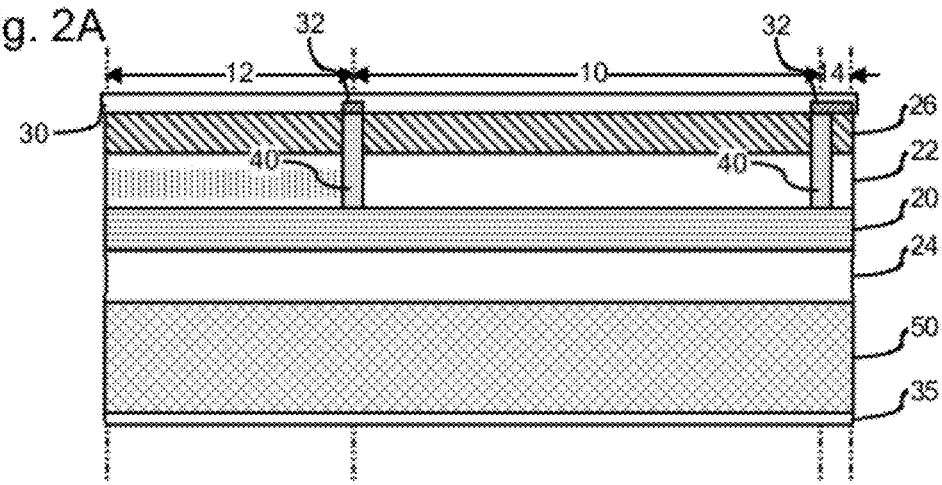
FIG. 2A is a longitudinal schematic illustration of a DBR quantum cascade laser comprising p-type electrical isolation regions.

The DBR quantum cascade lasers illustrated in FIGS. 1 and 2A each comprise an active waveguide core 20 sandwiched between upper n-type cladding layers 22, 26 and a lower n-type cladding layer 24. The additional upper n-type cladding layer 26 is a highly n-type doped layer, compared to the n-type cladding layer 22 which is a relatively low n-type doped layer. The active core 20 and the upper and lower n-type cladding layers extend through the active gain section 10 and through the wavelength selective section 12 of the DBR quantum cascade laser. In a quantum cascade laser (QCL), the core layer 20 comprises alternating semiconductor layers that are configured to amplify light emitted during carrier transitions between energy states within the same energy band. A QCL is often referred to as a unipolar device because it utilizes quantum well transitions of a single carrier type. Most QCLs use electron transitions, in which case the layers both below and above the core are n-type cladding layers. The active gain and wavelength selective sections 10, 12 are capped with a patterned electrical contact layer 30 which comprises respective control electrodes dedicated to the different sections 10, 12 of the laser. An insulating dielectric material 32 is deposited in appropriate regions in the patterned electrical contact layer 30 to isolate electrically the distinct regions of the laser structure. Nevertheless, the present inventors have recognized that the DBR quantum cascade laser is subject to substantial electron diffusion from a non-dielectric-capped area to adjacent dielectric-separated areas.

Figure 2B:
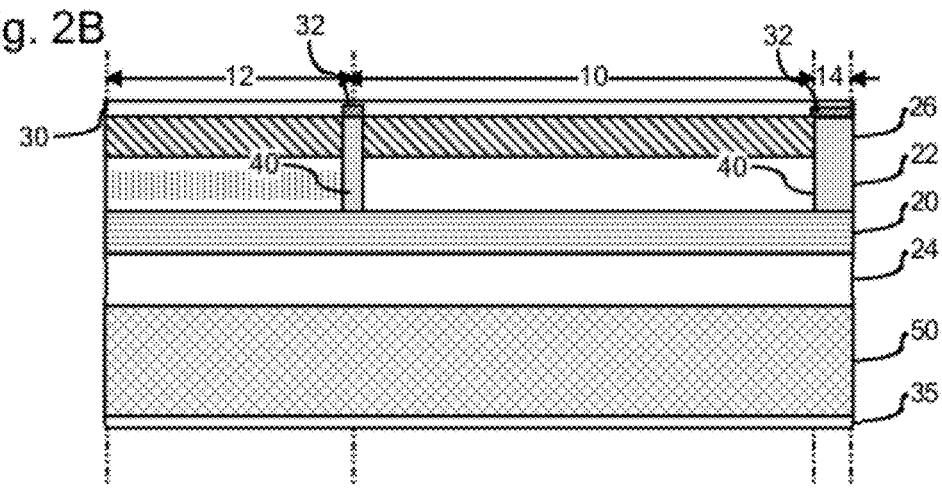
FIG. 2B illustrates an alternative to the window configuration illustrated in FIG. 2A.

In FIG. 2A, portions of the upper n-type cladding layers 22, 26 are provided with sufficient p-type dopant to define one or more p-type electrical isolation regions 40. Preferably, these electrical isolation regions 40 extend across a part of the thickness of the upper n-type cladding layers 22, 26 along respective projections separating the active gain section 10, the wavelength selective section 12, and the output window section 14 of the DBR quantum cascade laser. It is contemplated that these electrical isolation regions 40 can extend across a part or, more specifically, a majority of the thickness of the upper n-type cladding layers 22, 26. As is illustrated in FIG. 2B, it is contemplated that the window section 14 can be all p-doped above the active core 20. It is further contemplated that a corresponding window section can be provided at the input facet of the laser structure. Additionally, it is contemplated that the window sections need not be provided in the laser structure at all.

There are diverse ways of realizing the p-type isolation regions. Among these are selective growth, ion implantation, and diffusion of a p-type dopant. If the last option is chosen, the respective compositions of the upper and lower n-type cladding layers 22, 24, 26 and the active waveguide core 20 may be selected to facilitate formation of the p-type electrical isolation regions 40 by dopant diffusion. More specifically, the upper and lower n-type cladding layers 22, 24, 26 may comprise InP and the p-type dopant may be selected such that its maximum stable concentration in the InP upper n-type cladding layer is below approximately $n \times 10^{18}$ cm$^{-3}$, where n is less than 3.

By way of example, and not limitation, it is alternatively contemplated that the upper and lower n-type cladding layers 22, 24, 26 may be GaAs-based cladding layers. Some of the cladding layers may be AlGaAs or (Al)GaInP instead of simply GaAs or InP. For GaAs-based cladding layers, the core may be GaAs/AlGaAs, AlGaAs/AlGaAs, (Al)GaInP/(Al)GaInP, or GaInAs/(Al)GaAs. Additional layers of similar composition are contemplated for the remaining layers of the structure and should be selected to compensate for any lattice-mismatch between GaInAs and the GaAs substrate. For example, and not by way of limitation, other possible layers are GaInP, AlGaInP, GaAsP, and GaInAsP. For GaAs-based cladding layers, suitable dopants used to make (Al)GaAs semi-insulating include, but are not limited to Cr and O. At very low temperature growth, semi-insulating (Al)GaAs can be obtained without any dopant.

In some embodiments, the alternating semiconductor layers of the active waveguide core 20 comprise alternating Group III-V materials in which the maximum stable concentration of the dopant in the core is at least a factor of 10 greater than the maximum stable concentration of the p-type dopant in the upper n-type cladding layer. In some instances, the resulting device, which comprises core and cladding layers that define substantially different maximum stable dopant concentrations can be well suited for formation of the p-type electrical isolation regions 40 of the present disclosure, particularly where there is a desire to keep the dopant out of the core. In other instances, it may be preferable to allow the dopant to diffuse into the core 20.

The p-type electrical isolation regions 40 can also be formed by ion implantation, in which case, it will merely be necessary to ensure that the p-type dopant defines a p-doping concentration that is higher than the n-doping concentration of the upper cladding layer.

More specifically, the QCL illustrated in FIG. 2A is grown on an InP substrate 50 and the core 20 is surrounded by InP cladding layers 22, 24, 26. The maximum-stable concentration of p-type dopants like Zn, Cd, Be, Mg, and Mn are relatively low in InP. A p-type dopant diffuses relatively quickly above its maximum-stable concentration and its diffusion coefficient increases super-linearly with its concentration. For example, the maximum-stable concentration of Zn in InP is between approximately $1 \times 10^{18}$ cm$^{-3}$ and approximately $2 \times 10^{18}$ cm$^{-3}$. Accordingly, when diffusion of Zn is used to form the p-type electrical isolation regions 40 of the present disclosure, the Zn-dopant concentration in the area converted to p-type via diffusion will be no more than approximately $2 \times 10^{18}$ cm$^{-3}$. The present inventors have recognized that a low dopant level is advantageous because optical loss increases with carrier concentration, so not having to introduce a high concentration of p-type dopant keeps the loss low. Further, at this concentration level, Zn diffuses little through the QCL core 20, which may, for example, be composed of GaInAs and AlInAs, partly because the concentration of the diffusing Zn is a factor of 10 lower than the maximum stable concentration of the dopant in the core 20. For example, and not by way of limitation, the maximum stable concentration of typical dopants in a core composed of GaInAs and AlInAs is between approximately $1 \times 10^{19}$ cm$^{-3}$ and approximately $6 \times 10^{19}$ cm$^{-3}$. Accordingly, if Zn diffuses down to the core 20, it will be stopped very quickly inside the top layers of the core 20. Typically the p-type electrical isolation regions 40 extend from the top of the core to within approximately 1.5 μm of the core layer 20.

Although QCLs according to the present disclosure can be fabricated using a variety of materials and layer configurations, it is contemplated that the portion of cladding layer 22 through which Zn is to be diffused be between 0.5 and 3 μm, with an original n-type doping density of less than $0.5 \times 10^{18}$ $cm^{-3}$. Similarly, the core 20 may comprise alternating layers of Group III-V wells and Group III-V barriers and, more specifically, alternating layers of GaInAs wells and AlInAs barriers or Sb-containing material(s). The core region typically includes a plurality (e.g., 10 or more, but typically more than 20) of essentially identical multilayer semiconductor repeat units selected for lasing in a wavelength range centered around the particular desired lasing wavelength.

Figure 4A:
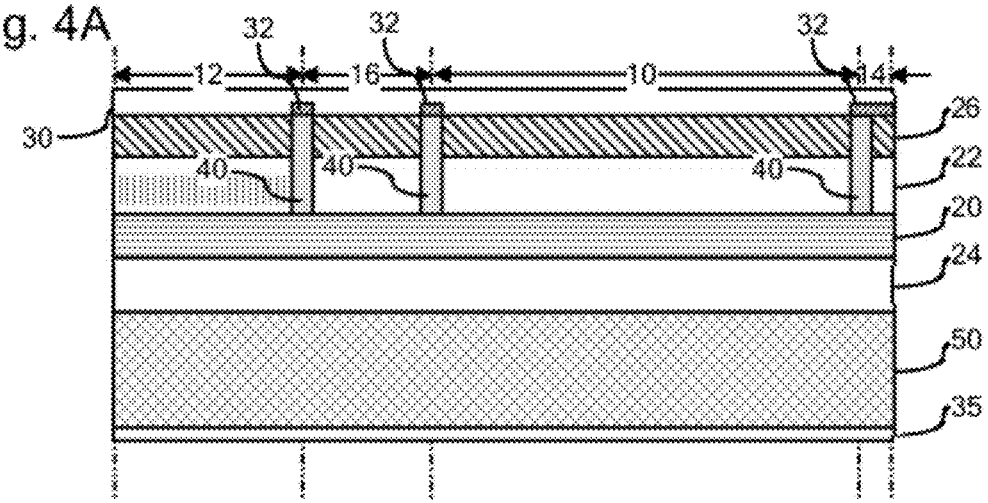
FIGS. 4A and 5A are longitudinal schematic illustrations of DBR quantum cascade lasers according to two alternative embodiments of the present disclosure.
Figure 5A:
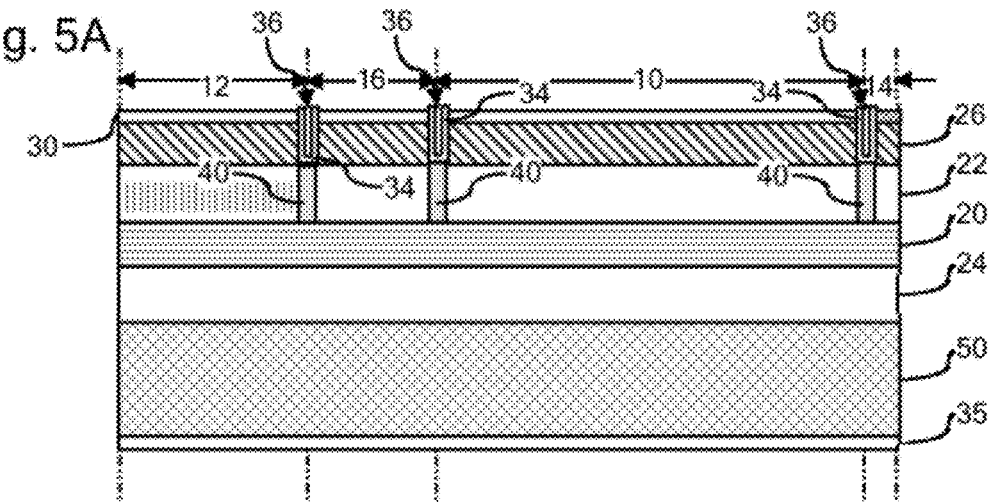

Referring now to FIGS. 4A and 5A, it is noted that the p-type electrical isolation regions 40 according to the present disclosure may extend across the upper n-type cladding layer 22 along projections separating the active gain section 10, the wavelength selective section 12, the output window section 14, and the phase section 16 of the DBR quantum cascade laser. Although the wavelength selective, phase, and window sections of the QCL are illustrated in FIGS. 4A and 5A with dedicated patterned portions of an electrical contact layer 30, it is contemplated that these sections may be active or passive. As is illustrated in FIG. 4B, it is contemplated that the window section 14 can be all p-doped above the active core 20. FIG. 5B illustrates an alternative to the window configuration illustrated in FIG. 5A where the trench of FIG. 5A is not utilized, the window section 14 is partially p-doped above the active core 20, and the metal contact is positioned over the top of the partially p-doped section for better heat sink.

Figure 6:
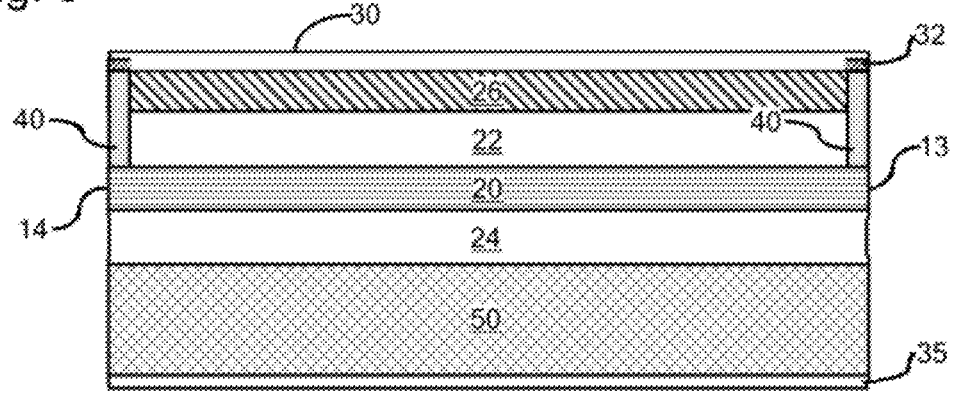
FIGS. 6 and 7 are schematic illustrations of laser structures where isolation regions are solely provided adjacent the facets of a semiconductor laser.
Figure 7:
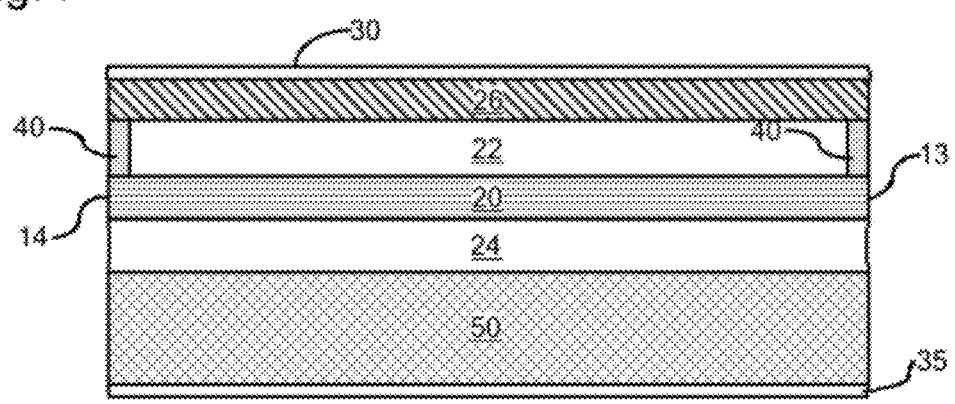

In many embodiments, it is contemplated that the window sections 14 described herein will not be provided with a p-type electrical isolation region, particularly where there is no desire to provide vertical isolation in the window sections of the laser. Conversely, laser structures are also contemplated where isolation regions are solely provided in one or both of the window sections of the semiconductor laser to provide vertical isolation therein. More specifically, referring to FIGS. 6 and 7, as will be appreciated by those practicing the concepts of the present disclosure, semiconductor lasers will typically comprise opposing facets 13, 14 that are configured with reflectivity characteristics suitable to form the resonant cavity of the laser, with facet 13 forming the output window of the laser. The present inventors have recognized a continuing drive to provide robust laser facets in semiconductor lasers, particularly semiconductor lasers that are subject to acute facet heating and substantial current injection into the active region of a laser in the vicinity of the laser output window. These problems are particularly acute in the context of lasers characterized by relatively high output powers and the present disclosure addresses the continuing drive to fabricate robust facets for a variety of semiconductor lasers including, but not limited to, DBR or non-DBR quantum cascade laser, Fabry-Perot lasers, or any semiconductor laser with input/output facets where the aforementioned degradation is a concern.

To this end, it is contemplated that the upper n-type cladding layer 22 can be provided with sufficient p-type dopant to define p-type isolation regions 40 adjacent at least one or each of the opposing facets 13, 14. It is contemplated that this isolation region 40 can extend across a part or, more specifically, a majority of the thickness of the upper n-type cladding layer 22 adjacent the facet 13 defining the laser output window, the opposing facet 14, which may define the laser input window, or both facets 13, 14. The laser may be a DBR or non-DBR quantum cascade laser, a Fabry-Perot laser, or any semiconductor laser with input and/or output facets. Constructed in this manner, it is contemplated that the p-type isolation region 40 will reduce the current into regions adjacent the facets 13, 14 of the laser, and help minimize potentially harmful facet heating, without interfering with the structure of the active waveguide core 20. Further, it is contemplated that, where the laser comprises a patterned electrical contact layer 30 configured to initiate electrical current injection into the active waveguide core 20, the p-type isolation region 40 will, with or without the aid of a facet dielectric 32, inhibit current injection into the facet regions of the active waveguide core 20.

It is also contemplated that the opposing facets can be provided with anti-reflective coatings, highly reflective coatings, or combinations thereof.

The illustrations of the present disclosure also show an additional n-type InP cladding layer 26 sandwiched between the patterned electrical contact layer 30 and the upper n-type cladding layer 22. The additional n-type InP cladding layer 26 is more highly doped than the upper n-type cladding layer 22, e.g., up to about $1 \times 10^{19}$ $cm^{-3}$. The relatively highly doped n-type InP cladding layer 26 has a relatively low refractive index at the operational wavelengths of interest, which prevents the mode from extending further and being absorbed by the contact layers and metals in the laser structure. As will be appreciated by those familiar with laser construction and operation, the electrical contact metal is used to facilitate the flow of an electrical current through the laser. In FIGS. 2A and 4A, the p-type electrical isolation regions 40 extend across the upper n-type cladding layer 22 and the additional n-type InP cladding layer 26.

As illustrated on FIG. 5A, trenches 36 may be etched at least partially or entirely through the additional n-type InP cladding layer 26. Trenches 36 may be particularly advantageous when the p-type electrical isolation regions 40 are formed by diffusing a p-type dopant into the layers 22 and 26. By etching a trench through the additional layer 26, the p-type isolation region 40 may be more quickly diffused with a p-type dopant, such as Zn, because the dopant does not have to diffuse through the entire additional n-type cladding layer 26 in order to reach and diffuse into the upper n-type cladding layer 22. An additional dielectric isolation layer 34 is optionally provided on the walls of trenches 36 formed in the additional n-type InP cladding layer 26. With this construction, the p-type electrical isolation regions 40 do not extend across a significant portion of the additional n-type InP cladding layer 26. Metal or other conductive materials that could short circuit the isolation regions 40 should not be permitted in the trenches 36. Alternatively, p-type isolation regions 40 may be formed in the upper n-type cladding layer 22, either by implantation or diffusion, prior to formation of the additional n-type cladding layer 26. The additional n-type cladding layer 26 may then be formed on the upper n-type cladding layer 22. The upper portion of the p-type isolation regions 40 may then be formed in the additional n-type cladding layer 26 either by implantation or diffusion. Alternatively, rather than doping the regions in the additional n-type cladding layer 26 above the p-type isolation regions 40 formed in the upper n-type cladding layer 22, the regions in the additional n-type cladding layer 26 above the p-type isolation regions 40 in the upper n-type cladding layer 22 may be etched away forming trenches 36 in the additional n-type cladding layer 26 as previously described herein.

In each of the illustrated configurations, the DBR quantum cascade laser comprises an additional electrical contact layer 35 on the substrate 50. It is contemplated that the substrate 50 may be n-doped InP or any of a variety of group III-V materials suitable for a DBR quantum cascade laser. The lower n-type cladding layer 24 may be moderately n-doped InP. In addition, it is contemplated that the DBR quantum cascade laser may comprise one or more additional intervening layers interposed between the active waveguide core 20 and the upper and lower n-type cladding layers 22, 24. For example, the DBR quantum cascade laser may comprise a layer of GaInAs that is lattice-matched to InP, in which a grating may be defined. The GaInA layer, or layer of another composition, either only above or only below the core, or both below and above the core, may also serve as waveguide layer. As a further example, the DBR quantum cascade laser may comprise a buffer layer interposed between the lower n-type cladding layer 24 and the InP substrate 50. A buffer layer typically is used in semiconductor material epitaxial growth to form a smooth and clean surface for the growth of a high quality device structure, as will be appreciated by those skilled in the art. The buffer layer may be constructed of InP, indium-gallium-arsenide-phosphide (InGaAsP), indium-aluminum-arsenide-phosphide (InAlAsP), indium-aluminum-gallium-phosphide (InAlGaAs), or other Group III-V materials, or, in an alternative embodiment, it need not be present at all. If the buffer layer is InP, it is part of layer 24. If a QCL is grown by molecular beam epitaxy (MBE), the lower and upper cladding layers can be arsenide materials (GaInAs, AlInAs) because MBE cannot typically grow InP, in which case the cladding layers 22, 24, or layers between the cladding layers 22 and 24, will be arsenide materials.

Figure 3:
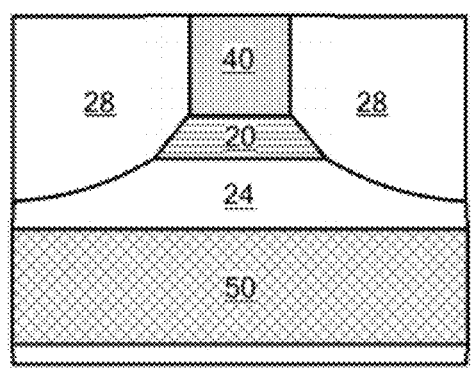
FIG. 3 is a transverse schematic illustration of a DBR quantum cascade laser comprising p-type electrical isolation regions.

Referring to FIG. 3, it is noted that the upper and lower InP n-type cladding layers 22, 24 and the active waveguide core 20 can be configured as a ridge waveguide bounded by semi-insulating InP regions 28. Semi-insulating InP can be generally grown by Fe doping. The present inventors have recognized, however, that pronounced interdiffusion of Fe and the p-type dopant in the upper cladding layer can be problematic in achieving reliable semi-insulating characteristics in the semi-insulating regions bounding the ridge waveguide structure. Accordingly, the present disclosure contemplates the fabrication of more stable semi-insulating InP regions by replacing Fe with a less diffusive deep trap or by adding to Fe another deep trap element including, for example, the transition metal Rh or Ru or Ti.

Area selective Zn diffusion can be performed by masking part of the wafer with a mask such as, for example, $SiO_2$, and exposing the whole wafer to Zn diffusion, after growth of the core and of the thickness of upper cladding layer 22 through which the p-sections are to extend. Zn only penetrates into the exposed semiconductor layers and therefore diffuses only in areas non-protected by SiO2. One possible technique for p-dopant diffusion is to heat the wafer after deposition on its surface of a gel containing this p-dopant. Zn diffusion can also be performed in a sealed ampoule, for example in the presence of a material, such as, $Zn_xAS_y$, or $Zn_xP_y$l.

In one example Zn diffusion is performed inside a metal-organic vapor phase epitaxy (MOVPE) reactor, the mask being silicon dioxide. The following fabrication sequence is contemplated according to the methodology of this example:
1. An InP lower cladding layer and a core composed of GaInAs wells and AlInAs barriers are grown. Subsequently, a selected thickness of n-type InP is grown, with the thickness and doping density of the n-type InP layer selected between approximately 0.5 μm and approximately 1.5 μm and approximately $2\text{-}10\times10^{16}$ cm$^{-3}$, respectively.
2. A relatively thin layer of mask material, such as $SiO_2$, is deposited and patterned to protect areas where no Zn diffusion is desired. Patterning can be realized by photolithography of a photoresist mask, followed by wet or dry etching of the $SiO_2$ layer where not protected by photoresist.
3. The wafer is placed back into the MOVPE reactor and Zn is made to diffuse into the unmasked areas. Our preferred technique is to cause Zn diffusion into InP from a top-grown heavily Zn doped GaInAs layer. The Zn concentration in GaInAs is higher than its maximum stable concentration to enable the Zn to diffuse into the n-type InP layer. At the interface between the highly Zn doped GaInAs and the InP layer, the Zn concentration will be higher than its stable concentration in InP, driving diffusion.
4. The Zn doped GaInAs surface layers as well as the $SiO_2$ mask can be etched away using dilute HF to dissolve the SiO2 and (10 H2O:1H2SO4:1H2O2) or any other suitable etchant for GaInAs.
5. A buried ridge QCL can be realized using any conventional or yet-to-be developed growth methodology including, for example, one of two ordinary options:
   i—grow the upper $n^-/n^+$ layers over the whole wafer, then define stripes, etch ridges downward through the core, and regrow semi-insulating on the sides of the ridges or simply coat the sides with an insulating material (so-called buried ridge laser or ridge laser, respectively);
   ii—grow only part of the upper $n^-/n^+$ layers, define stripes and form ridges, deposit semi-insulating InP on the sides of the ridges, remove the $SiO_2$ from the top of the ridges and grow the top $n^-/n^+$ layers everywhere (so-called planar buried heterostructure laser, the structure which we adopted).
6. For lateral electrical isolation between two electrodes, the n-doped layers above the p-doped layer in the short isolating regions are preferably etched away before deposition of the dielectric film.

It is noted that recitations herein of "at least one" component, element, etc., should not be used to create an inference that the alternative use of the articles "a" or "an" should be limited to a single component, element, etc.

It is noted that recitations herein of a component of the present disclosure being "configured" in a particular way or to embody a particular property, or function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

For the purposes of describing and defining the present invention it is noted that the terms "substantially" and "approximately" are utilized herein to represent the inherent degree of uncertainty that may be attributed to any quantitative comparison, value, measurement, or other representation.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects. For example, the illustrations of the present disclosure show laser diodes where current is injected into the wavelength selective and phase sections of a DBR laser for wavelength control. As will be appreciated by those familiar with laser diode construction and operation, heaters or heating elements can also be used to control these sections of a laser diode, in which case a dielectric film would be positioned on the top of wavelength selective and phase sections of the laser diode below a metal heating element.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A quantum cascade laser comprising one or more p-type electrical isolation regions and a plurality of electrically isolated laser sections extending along a waveguide axis of the laser, wherein:
    the quantum cascade laser comprises an active waveguide core sandwiched between upper and lower n-type cladding layers;
    the active core and the upper and lower n-type cladding layers extend through the electrically isolated laser sections of the quantum cascade laser;
    a portion of the upper n-type cladding layer comprises sufficient p-type dopant to define a p-type electrical isolation region that extends across at least a part of the thickness of the upper n-type cladding layer along a projection separating the electrically isolated laser sections of the quantum cascade laser; and
    the core layer comprises alternating semiconductor layers that are configured to amplify light emitted due to carrier transitions between energy states within the same energy band.

2. A quantum cascade laser as claimed in claim 1 wherein the upper and lower n-type cladding layers comprise InP and the p-type dopant is selected such that its maximum stable concentration in the upper cladding layer is below approximately n $\times 10^{18}$ cm$^{-3}$, where n is less than 3.

3. A quantum cascade laser as claimed in claim 1 wherein:
    the quantum cascade laser comprises a patterned electrical contact layer configured to separately initiate electrical current injection into sections of the active waveguide core; and
    the p-type electrical isolation region is configured for lateral electrical isolation between the electrically isolated laser sections of the active waveguide core.

4. A quantum cascade laser as claimed in claim 1 wherein the p-type electrical isolation region is formed by dopant diffusion into and through the portion of the upper n-type cladding layer.

5. A quantum cascade laser as claimed in claim 4 wherein the portion of the upper n-type cladding layer through which the dopant is diffused defines a layer thickness of between approximately 0.5 µm and approximately 2.5 µm.

6. A quantum cascade laser as claimed in claim 4 wherein the portion of the upper n-type cladding layer through which the dopant is diffused defines an n-type doping density of up to approximately 5 $\times 10^{17}$ cm$^{-3}$.

7. A quantum cascade laser as claimed in claim 1 wherein the p-type electrical isolation region extends to within approximately 1.5 µm from the core layer.

8. A quantum cascade laser as claimed in claim 1 wherein the concentration of the p-type dopant in the upper n-type cladding layer is no more than approximately 2 $\times 10^{18}$ cm$^{-3}$.

9. A quantum cascade laser as claimed in claim 1 wherein the alternating semiconductor layers comprise alternating Group III-V materials selected such that the maximum stable concentration of the dopant in the core is at least a factor of 10 greater than the maximum stable concentration of the p-type dopant in the upper n-type cladding layer.

10. A quantum cascade laser as claimed in claim 1 wherein the core comprises alternating layers of Group III-V wells and Group III-V barriers.

11. A quantum cascade laser as claimed in claim 1 wherein the core comprises alternating layers of GaInAs wells and AlInAs barriers.

12. A quantum cascade laser as claimed in claim 1 wherein the quantum cascade laser comprises a DBR laser and the plurality of electrically isolated laser sections of the quantum cascade laser comprise an active gain section and a wavelength selective section.

13. A DBR quantum cascade laser as claimed in claim 12 wherein:
    the DBR quantum cascade laser further comprises a phase section;
    the active core and the lower n-type cladding layer and most of the upper cladding layer extend through the active gain section, the phase section, and the wavelength selective section of the DBR quantum cascade laser;
    the p-type electrical isolation region extends across at least a part of the thickness of the upper n-type cladding layer along a projection separating the active gain section from the phase section and the wavelength selective section of the DBR quantum cascade laser; and
    an additional portion of the upper n-type cladding layer comprises sufficient p-type dopant to define an additional p-type electrical isolation region extending across at least a part of the thickness of the upper n-type cladding layer along a projection separating the phase section and the wavelength selective section of the DBR quantum cascade laser.

14. A DBR quantum cascade laser as claimed in claim 12 wherein:
    the quantum cascade laser further comprises an output window section;
    the active core and the upper and lower n-type cladding layers extend through the active gain section, the output window section, and the wavelength selective section of the quantum cascade laser; and
    an additional portion of the upper n-type cladding layer comprises sufficient p-type dopant to define an additional p-type electrical isolation region extending across at least a part of the thickness of the upper n-type cladding layer along a projection separating the gain section and the output window section of the quantum cascade laser.

15. A DBR quantum cascade laser as claimed in claim 12 wherein:
   the DBR quantum cascade laser comprises a patterned electrical contact layer;
   the patterned electrical contact layer comprises respective control electrodes dedicated to the wavelength selective section and the gain section, respectively; and
   the p-type electrical isolation region extends along a projection separating the active gain section and the wavelength selective section of the DBR quantum cascade laser.

16. A quantum cascade laser as claimed in claim 1 wherein the upper and lower n-type cladding layers and the active waveguide core are configured as a ridge waveguide and lateral confinement in the quantum cascade laser is provided by a raised ridge or semi-insulating regions bounding the ridge waveguide.

17. A DBR quantum cascade laser as claimed in claim 1 wherein:
   the p-type electrical isolation region is formed by dopant diffusion;
   the maximum stable concentration of the p-type dopant in the upper n-type cladding layer is no more than approximately $2 \times 10^{18}$ cm$^{-3}$; and
   the upper and lower n-type cladding layers and the active waveguide core are configured as a ridge waveguide bounded by semi-insulating regions.

18. A quantum cascade laser comprising one or more p-type electrical isolation regions and a plurality of electrically isolated laser sections extending along a waveguide axis of the laser, wherein:
   the quantum cascade laser comprises an active waveguide core sandwiched between upper and lower n-type cladding layers;
   the active core and the upper and lower n-type cladding layers extend through the electrically isolated laser sections of the quantum cascade laser;
   a portion of the upper n-type cladding layer comprises sufficient p-type dopant to define a p-type electrical isolation region that extends across at least a part of the thickness of the upper n-type cladding layer along a projection separating the electrically isolated laser sections of the quantum cascade laser;
   the p-type dopant defines a p-doping concentration that is higher than the n-doping concentration of the upper cladding layer; and
   the core layer comprises alternating semiconductor layers that are configured to amplify light emitted due to carrier transitions between energy states within the same energy band.

19. A method of fabricating one or more p-type electrical isolation regions in a quantum cascade laser, comprising:
   providing a quantum cascade laser that comprises a plurality of electrically isolated laser sections and an active waveguide core sandwiched between upper and lower n-type cladding layers, with the active core and the upper and lower n-type cladding layers extending through the electrically isolated laser sections of the quantum cascade laser and the core layer comprising alternating semiconductor layers configured to amplify light emitted due to carrier transitions between energy states within the same energy band; and
   forming one or more p-type electrical isolation regions in a portion of the upper n-type cladding layer by adding sufficient p-type dopant to define a p-type electrical isolation region that extends across at least a part of the thickness of the upper n-type cladding layer along a projection separating the laser sections of the quantum cascade laser.

20. A method as in claim 19, wherein the upper and lower n-type cladding layers comprise InP and the p-type dopant is selected such that its maximum stable concentration in the InP upper n-type cladding layer is below approximately n $\times 10^{18}$ cm$^{-3}$, where n is less than 3.

21. A method as in claim 19 wherein the p-type electrical isolation region is formed by ion implantation.

22. A method as in claim 19 wherein the p-type electrical isolation region is formed by diffusion.

* * * * *